(12) United States Patent
Camarota

(10) Patent No.: US 7,023,238 B1
(45) Date of Patent: Apr. 4, 2006

(54) INPUT BUFFER WITH SELECTABLE THRESHOLD AND HYSTERESIS OPTION

(75) Inventor: Rafael C. Camarota, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 10/753,585

(22) Filed: Jan. 7, 2004

(51) Int. Cl.
*H03K 19/173* (2006.01)
*G06F 7/38* (2006.01)

(52) U.S. Cl. .......................... 326/38; 326/40; 327/205
(58) Field of Classification Search ................ 326/38, 326/39, 40, 41, 47; 327/205
See application file for complete search history.

(56) References Cited

U.S. PATENT DOCUMENTS

| | | | |
|---|---|---|---|
| 4,539,489 A | 9/1985 | Vaughn | |
| 4,563,594 A | 1/1986 | Koyama | |
| 4,563,595 A | 1/1986 | Bose | |
| 4,703,201 A | 10/1987 | McGrail | |
| 4,719,367 A | 1/1988 | Denda | |
| 4,783,607 A | 11/1988 | Hsieh | |
| 4,786,825 A | 11/1988 | O'Shaughnessy et al. | |
| 4,859,873 A | 8/1989 | O'Shaughnessy et al. | |
| 4,883,975 A | 11/1989 | Enomoto et al. | |
| 5,144,167 A | 9/1992 | McClintock | |
| 5,155,386 A * | 10/1992 | Abdi ........................... | 327/67 |
| 5,327,020 A | 7/1994 | Ikeda | |
| 5,359,243 A | 10/1994 | Norman | |
| RE34,808 E | 12/1994 | Hsieh | |
| 5,438,292 A | 8/1995 | Tadokoro | |
| 5,489,866 A | 2/1996 | Diba | |
| 5,874,844 A | 2/1999 | Shin | |
| 5,886,556 A | 3/1999 | Ganger et al. | |
| 5,945,859 A | 8/1999 | Pang | |
| 6,060,925 A | 5/2000 | Chou | |
| 6,091,264 A | 7/2000 | Kirsch et al. | |
| 6,163,166 A | 12/2000 | Bielby et al. | |
| 6,335,649 B1 | 1/2002 | Maeda | |
| 6,340,907 B1 | 1/2002 | Aoki | |
| 6,377,108 B1 * | 4/2002 | Kennedy et al. ............ | 327/407 |
| 6,433,602 B1 | 8/2002 | Lall et al. | |
| 6,597,224 B1 * | 7/2003 | Lin et al. .................... | 327/205 |
| 6,624,678 B1 | 9/2003 | Boutaud et al. | |
| 6,906,568 B1 * | 6/2005 | Lin et al. .................... | 327/205 |

\* cited by examiner

*Primary Examiner*—Daniel D. Chang
(74) *Attorney, Agent, or Firm*—Townsend and Townsend and Crew, LLP

(57) ABSTRACT

An input buffer is configurable for use as a standard buffer with a single switching threshold, selectable to be one of at least two different switching thresholds, or used as a Schmitt trigger circuit with hysteresis, which uses at least two switching thresholds from among the at least two different switching thresholds. The integrated circuit may be a programmable logic device (PLD) or field programmable gate array (FPGA), but in other embodiments, the integrated circuit may be other types of devices such a microprocessors, ASICs, or memories.

20 Claims, 4 Drawing Sheets

1

INPUT BUFFER WITH SELECTABLE THRESHOLD AND HYSTERESIS OPTION

BACKGROUND OF THE INVENTION

This invention relates generally to integrated circuits. More specifically, this invention relates to a programmable logic device with buffers that may be selectively configured for Schmitt-triggered or threshold-triggered operation.

Buffer circuits are one of the building blocks of a digital system. A typical integrated circuit has many numbers of buffers. A typical buffer, such as an inverter, noninverting buffer, input buffer, or output buffer, detects a level change at its input based on a fixed switching threshold. For an inverting buffer, an input signal above this threshold level, the output will be at a particular logic level (e.g., logic 0). For an input signal below this threshold, the output will be at the other logic level (e.g., logic 1).

Digital systems often operate under noisy conditions. Noisy conditions are usually defined as environments where there are signals switching unrelated to the signal of interest. In some cases, the noise content caused by coupling can be so large that false switching occurs. That is, noise can cause a metastable environment in which a digital low signal appears as a digital high signal, or vice versa. This sensitivity is especially acute for signals making slow transition from 1 to 0 or vice versa. They spend more time near the threshold where sensitivity is more acute.

An approach to eliminating or reducing the effects of noise in a digital system is to employ logic that relies upon a hysteresis detection scheme, instead of a fixed threshold detection scheme. In electronics, hysteresis refers to the property of a device to transition the output based on an asymmetric threshold voltage. The threshold is higher for a 0 to 1 input transition than a 1 to 0 input transition. Schmitt-trigger circuits are particularly useful for providing a smooth reliable output from a circuit that may have some noise on the input. This ability to smooth-out noise is increasingly important for integrated circuits, especially as supply voltage levels are dropping, which generally decreases input noise margins. This is also important for slow rising or falling inputs.

Schmitt trigger circuits generally have a propagation delay that is greater than a similar sized buffer circuit without hysteresis. Therefore, in situations where higher performance (i.e., a faster speed path), it would be advantageous to use a fixed or symmetric threshold-triggered buffer over a Schmitt trigger circuit.

Therefore, it would be highly desirable to improve the noise immunity of selected buffers in a programmable logic device by utilizing Schmitt-trigger technology, while simultaneously exploiting fixed or symmetric threshold-triggered buffers at circuit nodes in programmable logic devices that have certain critical timing requirements.

BRIEF SUMMARY OF THE INVENTION

This invention is an input buffer that may be configured for use as a standard buffer with a switching threshold, selectable to be one of at least two different switching thresholds, or used as a Schmitt trigger circuit with hysteresis, which uses as at least two switching thresholds from among the at least two different switching thresholds. The integrated circuit may be a programmable logic device (PLD) or field programmable gate array (FPGA), but in other embodiments, the integrated circuit may be other types of devices such a microprocessors, ASICs, or memories.

This invention is a relatively inexpensive way (area-wise) to add a hysteresis option to integrated circuit, especially programmable logic devices with inputs that handle multiple input standards. The circuitry does not slow down significantly the normal input path. Additionally the hysteresis for this circuit would be a percentage of the VCCIO based on the switching threshold voltages of the ratio differential of the two standards. For example, if 0.1*VCCIO is available this would provide sufficient hysteresis for many applications.

In a specific embodiment, the invention is a programmable logic integrated circuit including a number of programmable interconnect lines, a number of logic array blocks, programmably connected to the programmable interconnect lines, and a number of input blocks, programmably connected to the programmable interconnect blocks, where signals output from the input blocks may be programmably connected using the programmable interconnect lines to input to the logic array blocks. An input block includes a first inverter buffer having a first switching threshold level and a second inverter buffer having a second switching threshold level, different from the first switching threshold level. The input block includes a first multiplexer having inputs connected to the first and second inverter buffers and a third inverter buffer connected to an output of the multiplexer, where an output of the third inverter buffer is programmably connected to a control input of the first multiplexer.

There may be a second multiplexer including an output connected to the control input of the first multiplexer, and inputs connected to a first memory bit and the output of the third inverter buffer. There may be a second memory bit coupled to a control input of the second multiplexer.

In another embodiment, the invention is a method of operating an integrated circuit including providing an input buffer capable of operating as a standard buffer having one of at least two different switching thresholds in a first mode or a Schmitt trigger in a second mode. A mode bit is configured to control whether the input buffer operates in the first mode or the second mode. When in the second mode, an output is fed back from a buffer to a control input of a multiplexer circuit. When in the first mode, a configuration bit is connected to a control input of the multiplexer circuit.

In another embodiment, the invention is an integrated circuit including a first inverter buffer having a first switching threshold level, a second inverter buffer having a second switching threshold level, different from the first switching threshold level, and a first multiplexer having inputs connected to the first and second inverter buffers. A third inverter buffer is connected to an output of the multiplexer, where an output of the third inverter buffer is connected to a control input of the first multiplexer. A second multiplexer includes an output connected to the control input of the first multiplexer, and inputs connected to a first memory bit and the output of the third inverter buffer. A second memory bit is connected to a control input of the second multiplexer.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
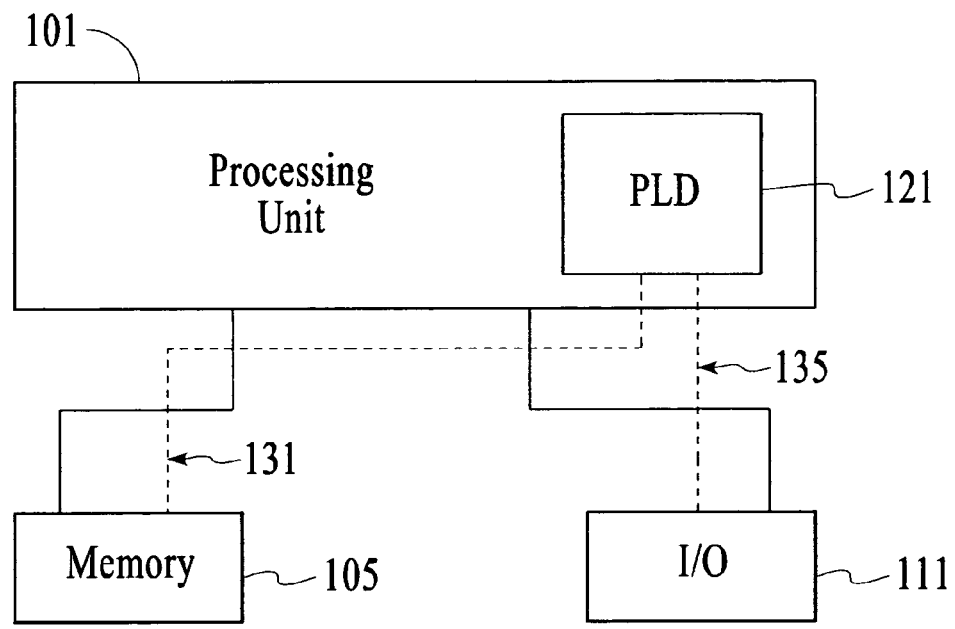
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, Hardcopy®, MAX®, FLEX®, APEX™, and STRATIX™ series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
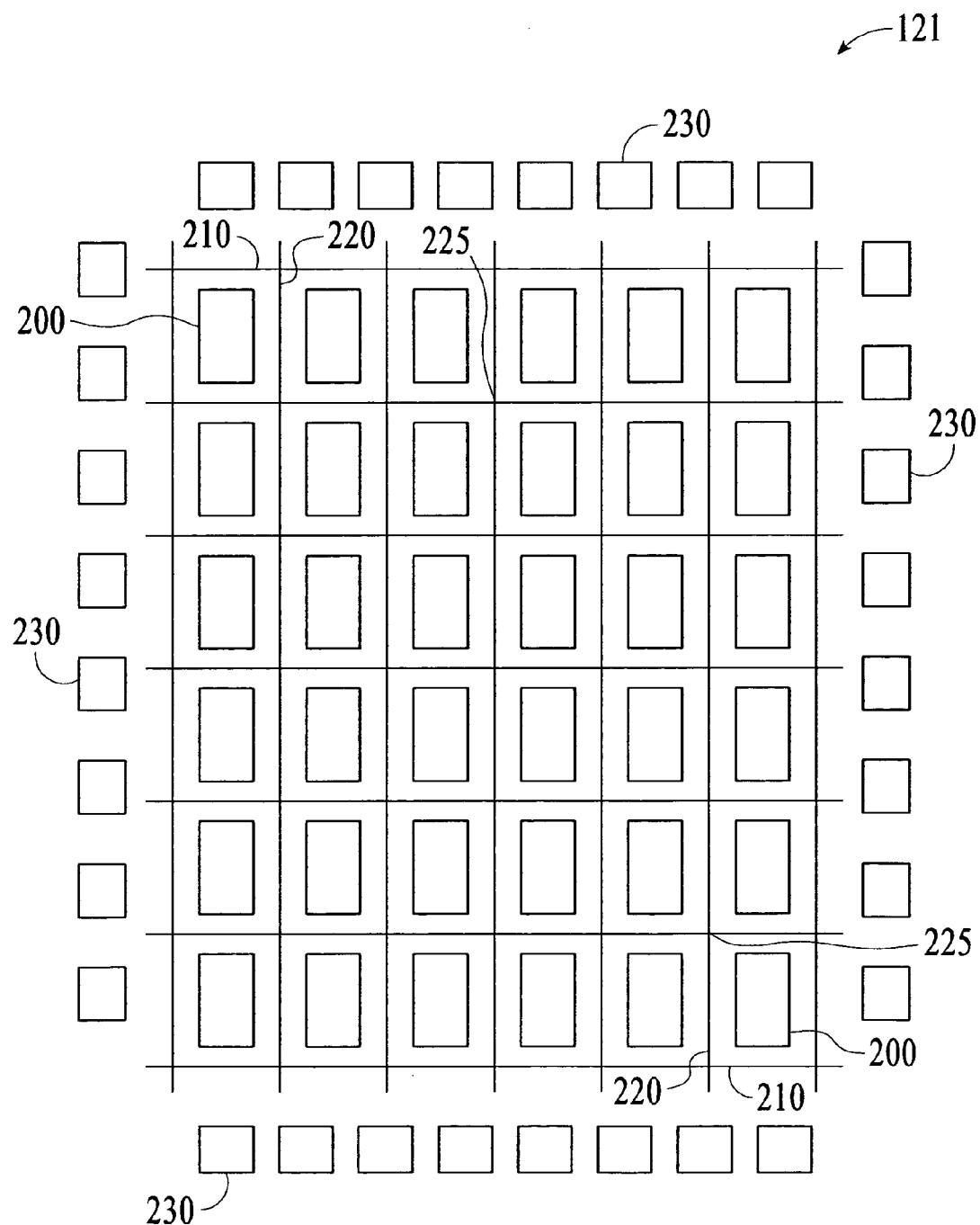
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver.

Figure 3:
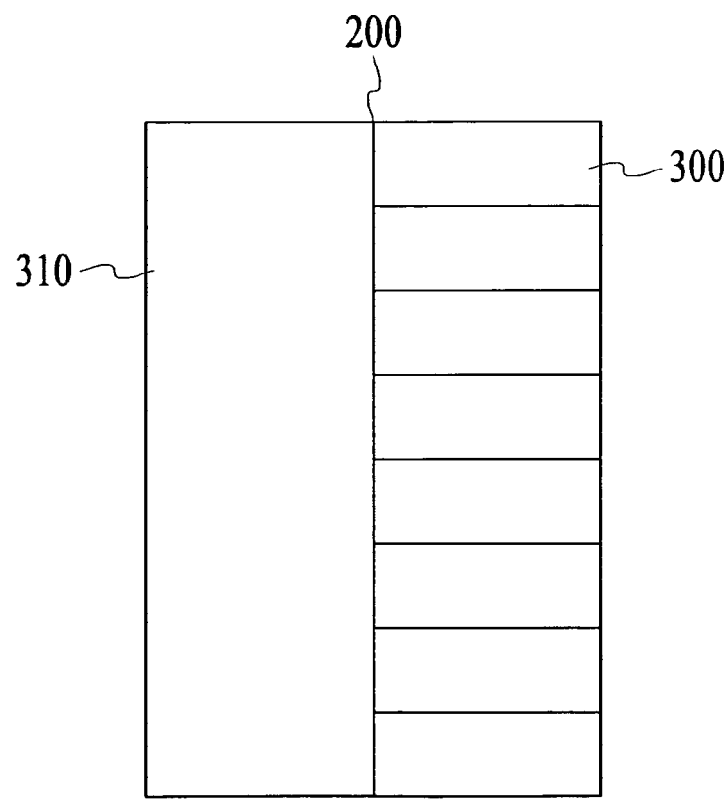
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such as a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
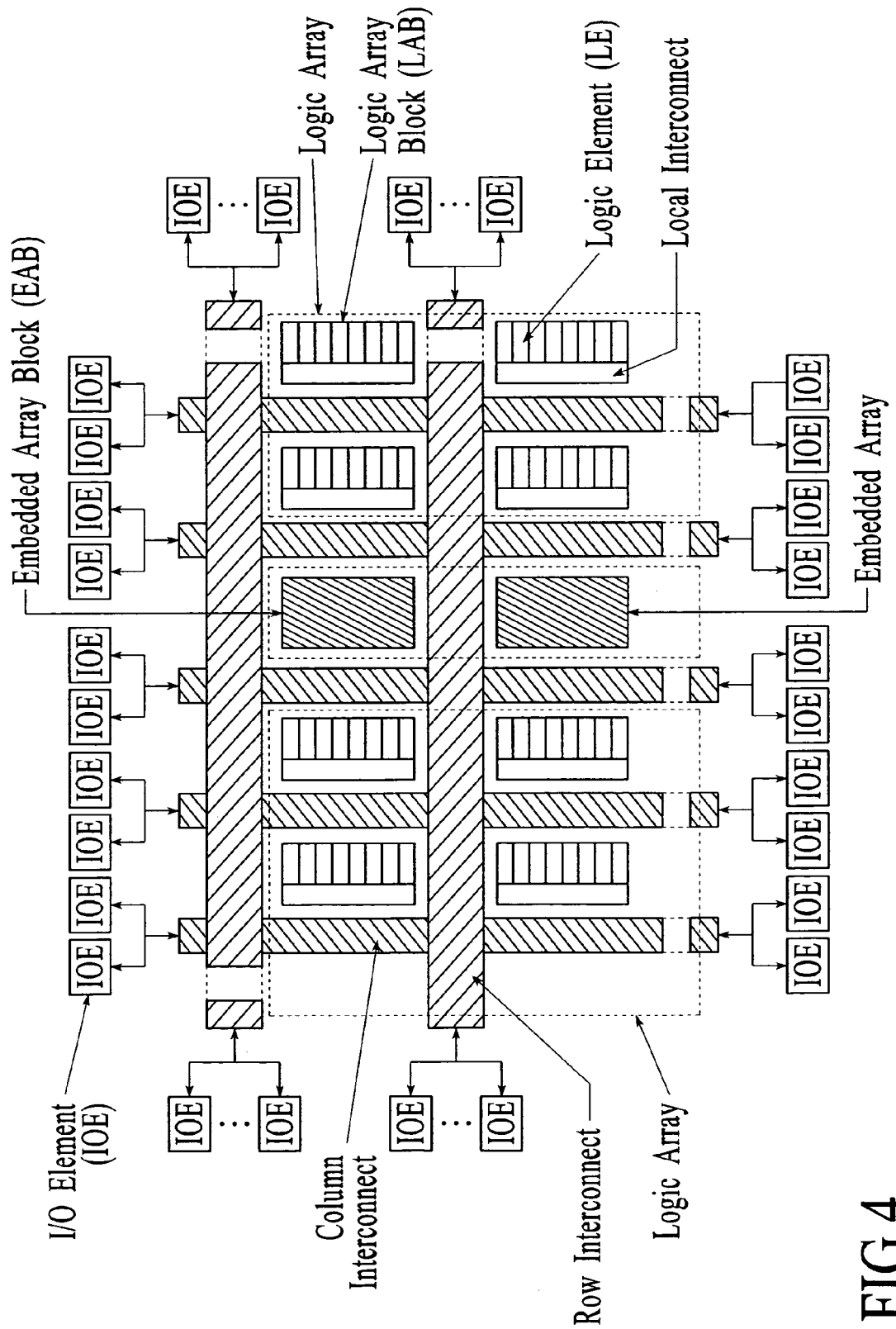
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX™ family of products are described in detail in the their respective data sheets, available via the Internet at www.altera.com.

Figure 5:
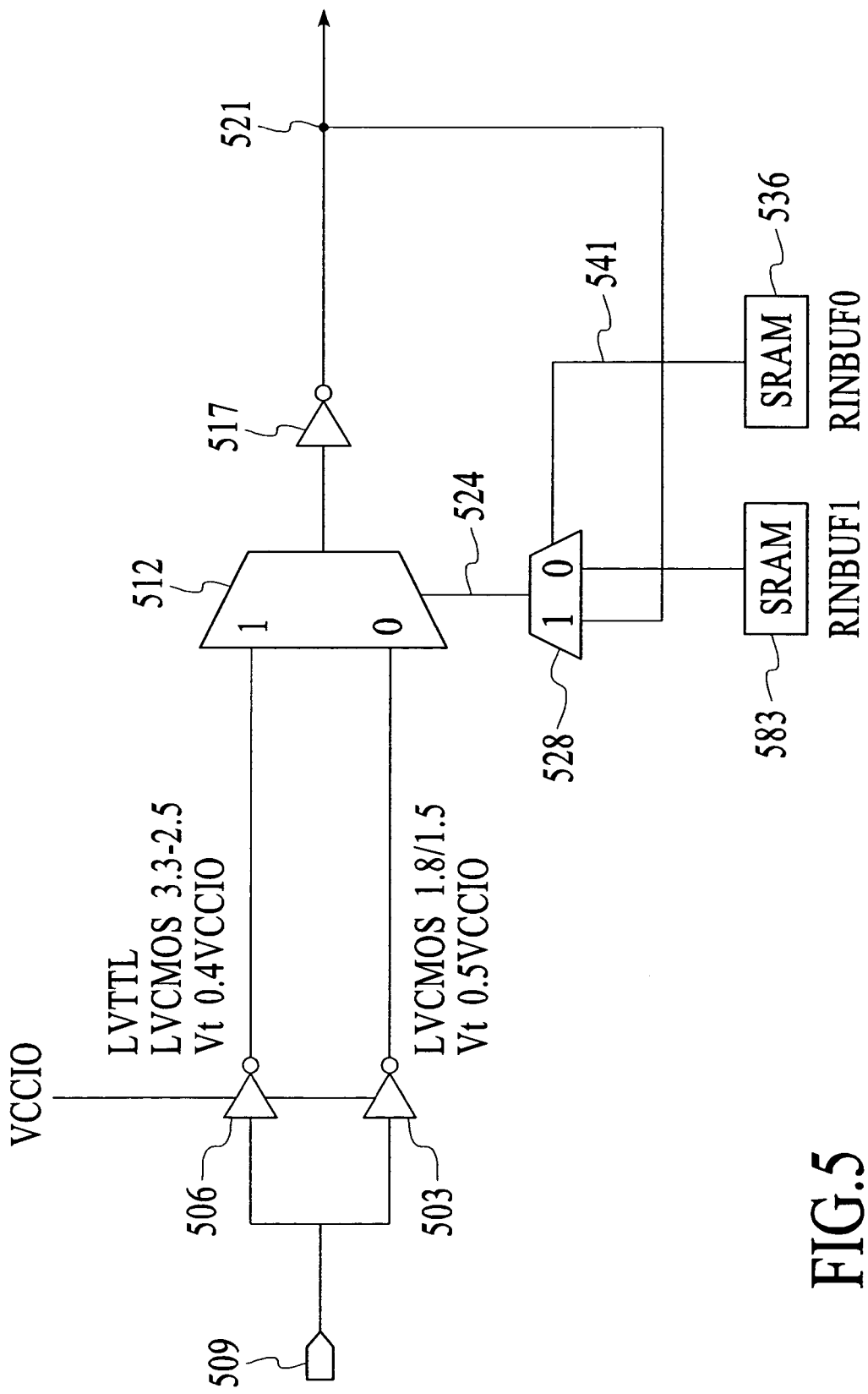
FIG. 5 shows an input buffer circuit with a hysteresis option.

FIG. 5 shows a circuit diagram of an input buffer with single-level threshold or a Schmitt trigger mode of operation. This input buffer may be a standalone input buffer for the integrated circuit or part of an input-output or I/O buffer or cell. For an I/O buffer, the input buffer of the invention may be combined with one or more output buffers. The FIG. 5 circuitry is merely an example of one specific implementation according to the principles of the invention. There may be many alternate implementations, and the circuitry may be modified to perform the desired function.

In a programmable logic device or in some other integrated circuits, input buffers are provided with different single-level thresholds in order to handle the different I/O standards. These input buffers may be part of a single input circuit, and a user may select which of the input buffers to use. An example of an input buffer for an integrated circuit is a TTL buffer. A TTL buffer takes a TTL input signal and translates it into logic levels compatible for the internal of the chip. For example, these logic levels may be CMOS logic levels; this type of buffer is sometimes referred to as a TTL-to-CMOS buffer.

A programmable logic device may have buffers for the standard TTL input voltage levels, standard CMOS input voltage, low voltage TTL (LVTTL) input voltage levels, or low voltage CMOS input voltage levels, and in any combination these or other standards. For example, LVTTL levels may be a voltage input high (VIH) or 1.7 volts and a voltage input low (VIL) or 0.7 volts. The switching threshold would be between 0.7 and 1.7 volts, usually at about 1.2 volts. LVCMOS levels may have a VIH or 0.65*VCCIO (VCC provided to the I/O cell) and a VIL or 0.35*VCCIO. The switching threshold would be at about 0.5*VCCIO. In a typical embodiment, VCCIO is about 3.3 volts. Then VIH would be 2.145 volts and VIL would be 1.155 volts. The switch threshold (may be referred to as VT) would be 1.65 volts.

In FIG. 5, two buffers 503 and 506 are connected to an input 509. Input 509 may be an input pad or input pin to the device. There may be additional circuits connected to input 509, such as electrostatic discharge (ESD) structures or output drivers, but these are not shown. These two buffers have different single-level switching thresholds. Two buffers with two different switching thresholds are shown merely as an example. In other implementation of the invention, there may be more than two buffers with more than two switching thresholds. For example, there may be three, four, five, six, seven, eight or more buffers with different switching thresholds.

In a specific embodiment, buffer 503 is a LVCMOS buffer with a switching threshold of 0.5*VCCIO, and buffer 506 is a LVTTL buffer with a switching threshold of 0.4*VCCIO. VCCIO is a noisy VCC supply voltage. An integrated circuit may have a number of supply voltages including VCCIO and VCCQ, a quiet VCC supply voltage. The voltage levels for VCCIO and VCCQ may be different, but may be exactly the same level. VCCIO is typically provided for the circuitry where noise may be generated, such as at the I/O. VCCQ is typically provided for the circuit which runs more quietly or is more sensitive to noise, such as in the core or logic area or the integrated circuit. As an example, in an embodiment, VCCIO and VCCQ are at different potentials, where VCCIO is at about 3.3 volts and VCCQ is at about 1.8 volts.

Outputs of buffers 503 and 506 are provided to the inputs of a 2-to-1 multiplexer 512. If there are more than two buffers, the multiplexer would have more inputs. There is an inverter 517 at the output of multiplexer 512. The output of inverter 517 is an output 521 of this input buffer circuit. Output 521 may be used to drive logic and lines internal to the programmable logic integrated circuit, such as interconnect, LABs, LEs, or combinations of these. Multiplexer 512 and other multiplexers in the circuit may be implemented using any circuitry for multiplexing function including logic gates, pass gates, wired OR, and others.

For the input buffer circuit of FIG. 5, there are two inversions: a high at the input will mean the output will be high, and a low at the input will mean the output will be low. However, in other implementations, the buffer may have any number of inversions more or less than two. For example, the buffer may have a single inversion, or may have three, four, five, six, or more inversions. There may be an odd number of inversions, which means a high at the input will mean the output will be low, and a low at the input will mean the output will be high.

Multiplexer 512 has a control input 524, which is provided by an output of a multiplexer 528 that has two inputs. One input is connected to an SRAM bit 533 and the other input is connected to output 521. Another SRAM bit 536 is connected to a control input 541 of the multiplexer.

In this specific implementation, a user will configure operation of the circuit by storing bits in SRAM bits 533 and 536. For example, when single level buffer operation is desired, SRAM bit 536 will be 0, and input 0 of multiplexer 528 is selected. SRAM bit 533 will be used to select which of the inputs to multiplexer 512 will be used. If SRAM bit 533 is a 0, LVCMOS buffer 503 is selected, and the switch threshold for the input buffer circuit will be 0.5*VCCIO. However is SRAM bit 533 is a 1, the LVTTL buffer 506 is selected, and the switch threshold for the input buffer will be 0.4*VCCIO.

If Schmitt trigger operation is desired, SRAM bit 536 is configured to be a 1, and output 521 feeds back to control input 512. Depending on a state of output 521, one of the LVCMOS or LVTTL buffers will be selected. Specifically, if the output is 0, the LVCMOS buffer with 0.5*VCCIO threshold is selected, while if the output is 1, the LVTTL buffer with 0.4*VVCIO threshold is selected. When in Schmitt trigger mode, the output buffer has two thresholds and provides hysteresis. When in Schmitt trigger operation, the circuit provides greater noise margins than under standard buffer operation. Two buffers 503 and 506 are shown, but as discussed above, there may be more than two buffers to select thresholds from.

This circuit configuration of the invention minimizes the performance impact of providing a Schmitt trigger operation on standard buffer operation. For a standard buffer without a Schmitt trigger option, SRAM bit 533 would feed directly into control input 524 and would select inverter buffer 503 or 506. To implement a Schmitt trigger option, some additional circuitry is added, SRAM bit 536 and multiplexer 528. However, the circuit is designed so these addition components do not impact the speed path greatly, especially when the circuit is used for standard buffer operation. There is some additional loading at the output of inverter 517 from the input to multiplexer 528 causes some additional loading. However, the speed impact from this is minimal.

In the FIG. 5 implementation, SRAM bits are used to hold user-selected configuration values. However, in other implementations, other technologies or circuits may be used to hold these bits including Flash, EEPROM, EPROM, PROM, SRAM, RAM, DRAM, fuse, antifuse, and others. Furthermore, the bits may be stored using a register, flip-flops, or logic gates. Also, the bits may be supplied by user-supplied logic signals, internal or external, or other logic signals, and these signals may be dynamically changed during operation of the integrated circuit. For example, the bits may be provided by logic from internal to the integrated circuit. An output from a LAB or LE may feed to control multiplexer 538 or 524. This would provide a user with additional flexibility in configuring operation of the circuit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A programmable logic integrated circuit comprising:
  a plurality of programmable interconnect lines;
  a plurality of logic array blocks, programmably coupled to the programmable interconnect lines; and
  a plurality of input blocks, programmably coupled to the plurality of logic array blocks, wherein signals output from the input blocks are programmably coupled using the programmable interconnect lines to input to the plurality of logic array blocks, an input block comprising:
  a first buffer configured to receive an input signal and to provide a first output signal having a first polarity when the input signal is below a first switching threshold level, and provide a second polarity when the input signal is above the first switching threshold level;
  a second buffer configured to receive the input signal and to provide a second output signal at third polarity when the input signal is below a second switching threshold level, and provide the output signal at a fourth polarity when the input signal is above the second switching threshold level, wherein the second switching threshold level is different from the first switching threshold level;
  a first multiplexer having inputs coupled to the first and second buffers; and
  a third buffer coupled to an output of the multiplexer, wherein an output of the third buffer is programmably coupled to a control input of the first multiplexer, wherein the third buffer is programmably coupled to an output of the first buffer or an output of the second buffer though the first multiplexer.

2. The programmable logic integrated circuit of claim 1 wherein the first buffer provides a switching threshold for a LVCMOS standard.

3. The programmable logic integrated circuit of claim 2 wherein the second buffer provides a switching threshold for a LVTTL standard.

4. The programmable logic integrated circuit of claim 1 further comprising:
  a second multiplexer comprising an output coupled to the control input of the first multiplexer, and inputs coupled to a first memory bit and the output of the third buffer.

5. The programmable logic integrated circuit of claim 4 further comprising:
  a second memory bit coupled to a control input of the second multiplexer.

6. The programmable logic integrated circuit of claim 4 wherein the first memory bit is implement using at least one of a SRAM, Flash, EEPROM, EPROM, PROM, RAM, DRAM, fuse, or antifuse cell.

7. The programmable logic integrated circuit of claim 5 wherein when the second memory bit is in a first state, the input block operates as a buffer with a single switching threshold level, selectable via the first memory bit, and in a second state, the input block operates as a buffer having hysteresis.

8. The programmable logic integrated circuit of claim 5 wherein when the second memory bit is in a first state, the input block operates as a buffer with a single switching threshold level, selectable via the first memory bit, and in a second state, the input block operates as a Schmitt trigger circuit.

9. The programmable logic integrated circuit of claim 1 wherein the switching threshold of the first buffer is about 0.5*VCCIO and the switching threshold of the second buffer is about 0.4*VCCIO.

10. A method of operating an integrated circuit comprising:
providing an input buffer capable of operating as a standard buffer having one of at least two different switching thresholds in a first mode or a Schmitt trigger in a second mode;
configuring a mode bit to control whether the input buffer operates in the first mode or the second mode; and
when in the second mode, feeding back an output from a buffer to a control input of a multiplexer circuit.

11. The method of claim 10 further comprising:
when in the first mode, connecting a configuration bit to a control input of the multiplexer circuit.

12. The method of claim 10 wherein a first buffer couples to the multiplexer circuit to provide one of the switching thresholds and a second buffer couples to the multiplexer circuit to provide another one of the switching thresholds.

13. The method of claim 10 wherein the input buffer is part of an input-output buffer block of the integrated circuit.

14. The method of claim 10 wherein the integrated circuit is a programmable logic integrated circuit.

15. The method of claim 10 wherein the first switching threshold is higher than the second switching threshold.

16. The method of claim 10 wherein the first or the second switching threshold is at about 1.2 volts.

17. The method of claim 11 wherein the configuration bit is at least one of a SRAM, Flash, EEPROM, EPROM, PROM, RAM, DRAM, fuse, or antifuse cell.

18. A integrated circuit comprising:
a first inverter buffer having a first switching threshold level;
a second inverter buffer having a second switching threshold level, different from the first switching threshold level;
a first multiplexer having inputs coupled to the first and second inverter buffers;
a third inverter buffer coupled to an output of the multiplexer;
a second multiplexer comprising an output coupled to a control input of the first multiplexer, and inputs coupled to a first memory bit and an output of the third inverter buffer; and
a second memory bit coupled to a control input of the second multiplexer.

19. The integrated circuit of claim 18 wherein the first memory bit is implement using at least one of a SRAM, Flash, EEPROM, EPROM, PROM, RAM, DRAM, fuse, or antifuse cell.

20. The integrated circuit of claim 19 wherein the second memory bit is implement using at least one of a SRAM, Flash, EEPROM, EPROM, PROM, RAM, DRAM, fuse, or antifuse cell.

* * * * *